United States Patent [19]

Blachot

[11] 4,438,414
[45] Mar. 20, 1984

[54] TONE CONTROL CIRCUIT

[75] Inventor: Denis Blachot, Haussmann, France

[73] Assignee: Thomson-CSF, Paris, France

[21] Appl. No.: 320,494

[22] Filed: Nov. 12, 1981

[30] Foreign Application Priority Data

Nov. 14, 1980 [FR] France .................................. 80 24231

[51] Int. Cl.³ ............................................ H03H 7/03
[52] U.S. Cl. .................................. 333/28 T; 330/126;
 381/101
[58] Field of Search ............. 333/28 T; 307/520–522;
 328/167; 330/126; 179/1 D; 381/101, 102

[56] References Cited

U.S. PATENT DOCUMENTS 2,235,249  3/1941  Baxter ........................... 333/28 T X
3,932,819  1/1976  Spencer .......................... 330/126 X Primary Examiner—Paul L. Gensler
Attorney, Agent, or Firm—Oblon, Fisher, Spivak, McClelland & Maier

[57] ABSTRACT

A tone control circuit is provided having several parallel channels each of which comprises an electronic potentiometer. In each of the channels is disposed a filtering element. Thus, for an output terminal common to the different channels, each of the channels comprises a filter comprising a series element corresponding to the series element of this channel and a parallel element corresponding to the series elements placed in parallel of the other channels. The present invention simplifies the construction of tone control circuits in the form of integrated circuits.

6 Claims, 13 Drawing Figures

TONE CONTROL CIRCUIT

BACKGROUND OF THE INVENTION

1. Field of the Invention:

The present invention relates to a tone control circuit and more particularly a circuit adapted for adjusting the tone of a sound frequency signal, more especially a musical signal, in a sound signal diffuser such as a radio receiver, a television set, a recorded disk apparatus or a magnetic recording diffusion apparatus.

2. Description of the Prior Art:

In these different apparatus, it is currently provided for the user to be able to select the volume in different ranges of the frequency band so as to favor for example the bass (low frequency) or treble (high frequency). This adjustment is designed so as to adapt the sound diffusion to the particular musical tastes of the user and/or to correct the defects existing in the recorded or transmitted sound information.

Among the numerous circuit structures for obtaining this result, we frequently find at present circuit structures of the type shown in FIG. 1, in which a sound signal arriving at an input 1 is fed into three filters 2, 3 and 4, respectively a high-pass filter, a band-pass filter and a low-pass filter. These filters are disposed in parallel and their action on the incident signal is greater or smaller depending on the adjustment of the electronic potentiometers 5, 6 and 7 in series with each of these filters. The output signals of the electronic potentiometers are fed through a mixer circuit 8 to other circuits 9 required for shaping and suitably amplifying the electric signals for their transformation into sound form by means of a transducer such as a loud-speaker.

Nowadays, the aim is to insert the greater number of electric components of a given assembly on the same wafer in the form of an integrated circuit. That is generally not possible for filter elements which comprise capacitors and resistors of a well-defined value. Thus, in a circuit such as that in FIG. 1, the filters 2, 3 and 4 would be disposed outside the integrated circuit containing the elements surrounded by the broken line 10 and three terminals 11, 12 and 13 would have to be provided for access to the inputs of the electronic potentiometers and an output terminal 14.

As is well known, it would be advantageous in order to obtain a reduction in noise to dispose the different filters of each of the channels after the electronic potentiometer of the corresponding channel and not in front, so as to eliminate the noise produced by this electronic potentiometer in the band rejected by the filter. This arrangement is currently applied in circuits constructed from discrete elements but not in circuits constructed in integrated circuit form. In fact, as is shown in FIG. 2, in which the same elements are designated by the same references as in FIG. 1, instead of four terminals 11, 12, 13 and 14 for access to the integrated circuit 10, it would be necessary to provide eight access terminals, namely an input terminal 20, three output terminals 21, 22 and 23 for each of the electronic potentiometers, three input terminals 24, 25 and 26 feeding into a mixer or adder 8 and an output terminal 14 for this adder.

Now, it happens that one of the most important cost items in an integrated circuit resides in the number of its access terminals, i.e. in the number of its connection pins. It is also one of the most important sources of defects in integrated circuits. To obtain an improvement in the signal/noise ratio it is then out of the question to envisage providing four additional access terminals for the integrated circuit.

FIGS. 3A, 3B and 3C show by way of example particularly simple passive filters able to serve respectively as high-pass, band-pass and low-pass filters. The high-pass filter of FIG. 3A comprises a series element formed of a capacitor 31 and a parallel element formed by a resistor 32. The band-pass filter of FIG. 3B comprises a series element formed by a capacitor 33 and a resistor 34 in series and a parallel element formed by a resistor 35 and a capacitor 36 in parallel. The low-pass filter of FIG. 3C comprises a series element formed by a resistor 37 and a parallel element formed by a capacitor 38. Thus, the simplest filter assembly corresponding to the three filters 2, 3 and 4 of FIG. 2 comprises eight discrete components, i.e. four capacitors and four resistors. Such a number of discrete components would take up considerable space, in practice more than the integrated circuit comprising the different amplifiers 5, 6 and 7.

SUMMARY OF THE INVENTION

Thus, one object of the present invention is to provide a tone filtering circuit of the above-described type which minimizes the number of access terminals required for the integrated circuit comprising the electronic potentiometers.

Another object of the present invention is to provide such a tone control circuit in which the number of discrete elements of each of the filters is reduced in relation to the conventional devices.

To attain these objects as well as others, the present invention provides a tone control circuit comprising, between an input terminal and an output terminal connected to a high input impedance circuit, several parallel channels each of which comprises an electronic potentiometer and further comprising passive filters each of which comprises a series element and a parallel element. Each of the series elements is disposed between the output of each electronic potentiometer and said output terminal, which means that each filter is formed from the series element of a given channel and from a parallel element formed by the parallel association of the series elements of the other channels. Preferably, except for the filtering elements, this circuit is constructed in the form of an integrated circuit. In the case where the circuit only comprises two filtering channels, one for low-pass filtering and the other for high-pass filtering, the series element of the first channel may be a resistor and the series element of the second channel a capacitor. If the circuit comprises a third channel for pass-band filtering, the series element of this third channel may be formed by a resistor and capacitor disposed in series. Furthermore, in order to improve the filtering characteristics, an intermediate capacitor may be connected between the output of the electronic potentiometer of the third channel and an intermediate point of the resistor of the first channel. More generally, it is possible to provide intermediate elements connected between one channel and another so as to improve the filtering characteristics, it being understood that no ground connection is provided between the output terminals of the potentiometers and the connection point of the series elements.

The methods for adjusting the different electronic potentiometers will not be described in detail since the different existing systems may be used. More especially, the process for independent tone and volume adjustment such as described in French patent application No. 79/22885 filed by the present applicant on Sept. 13, 1979 may be used.

BRIEF DESCRIPTION OF THE DRAWINGS

These objects, characteristics and advantages as well as others of the present invention will be described in more detail in the following description of particular embodiments with reference to the accompanying drawings in which.

In the different figures, the same references designate similar elements or connection terminals.

DESCRIPTION OF THE PREFERRED EMBODIMENTS

Figure 1:
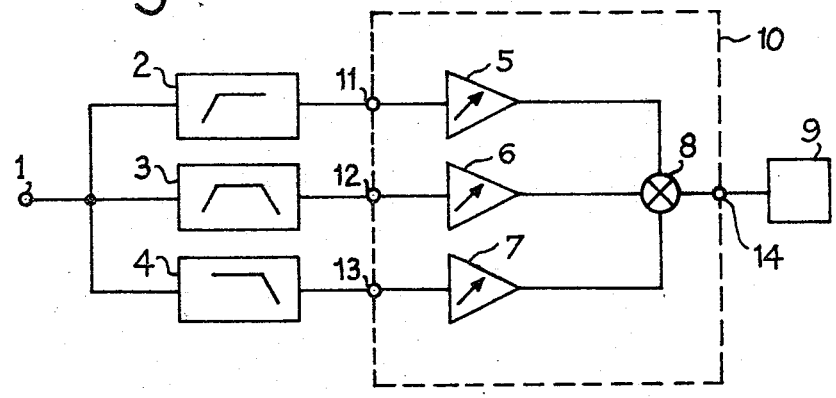
FIG. 1 shows a tone control circuit of the prior art which has already been described.
Figure 2:
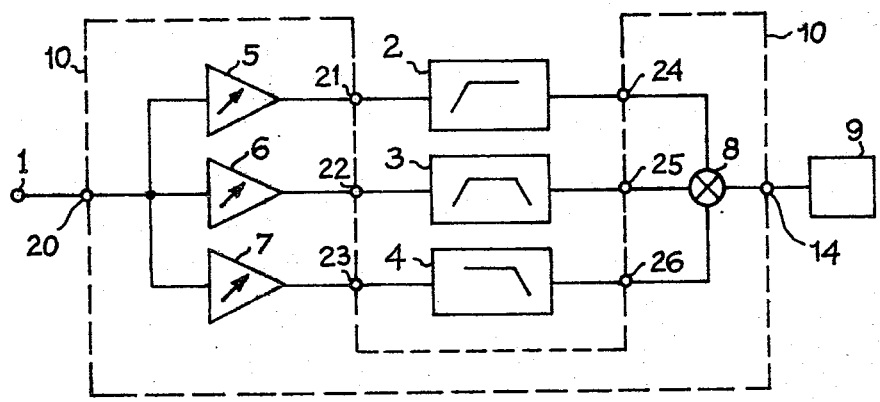
FIG. 2 shows a possible variation of the tone circuit of the prior art, which has also been described above.
Figures 3A, 3B, 3C:
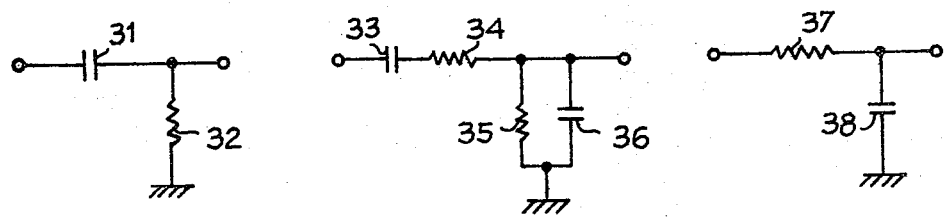
FIGS. 3A, 3B and 3C shows possible embodiments of filters usable in the tone control circuits of the prior art; these figures have also been described above.
Figure 4:
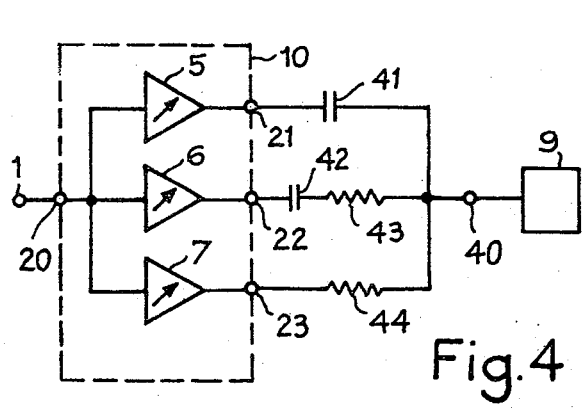
FIG. 4 shows one embodiment of the tone control circuit in accordance with the present invention.
Figure 5A:
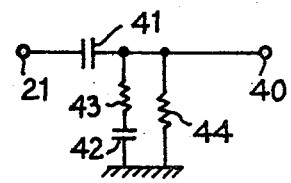
FIGS. 5A, 5B and 5C show filters equivalent to the filters obtained in the embodiment of FIG. 4.
Figure 5B:
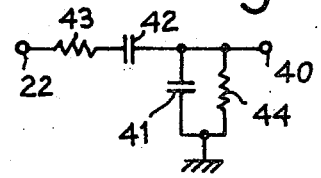
Figure 5C:
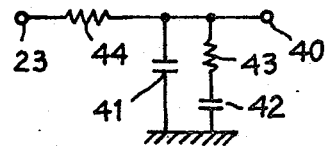

The circuit of the invention shown in FIG. 4 differs from the circuit shown in FIG. 2 essentially by the fact that there are no complete filters comprising grounded connection terminals, but only filter elements not having connection terminals to ground but connection terminals connected between the output of each of the electronic potentiometers and a common connection terminal 40 and not to different inputs of a mixer. Thus, taking the case where the assembly of circuits 9 presents a high impedance input and where each of the electronic potentiometers 5, 6 and 7 has a low impedance output, it may be considered, in accordance with the mathematical model called superposition theorem, that each of the outputs 21, 22 and 23 is connected to terminal 40 through a filter whose series element is formed by the element connected between this output and terminal 40 and whose parallel element, fictitiously connected to ground, is formed by the parallel association of the elements disposed between the output of the other electronic potentiometers and the common terminal 40. With this arrangement, as the particular embodiment of FIG. 4 shows, filters may be obtained using an extremely reduced number of components. In the case shown in FIG. 4, the series element of the first channel is formed by a capacitor 41, the series element of the second channel by a capacitor 42 in series with a resistor 43 and the series element of the third channel by a resistor 44. Thus, the filters equivalent to the output of the first, second and third channels are such as shown in FIGS. 5A, 5B and 5C. It will be noted that the total number of access terminals to the integrated circuit 10 is four, as in the case of FIG. 1, and not eight as in the case of FIG. 2.

Another advantage of the circuit of FIG. 4 with respect to the prior art circuits resides in the fact that, if the three electronic potentiometers 5, 6 and 7 are adjusted to the same gain, there is obtained at terminal 40 a signal proportional to the signal at the input terminal 20 without any filtering effect since there exists no ground connection between terminals 21, 22 and 23, on the one hand, and terminal 40 on the other. This level tonality is practically unobtainable with three filter assemblies such as filters 2, 3, 4 in FIGS. 1 and 2, whether these filters are disposed before or after the electronic potentiometers. It will be further noted that, to avoid this difficulty, in the prior art an additional channel was provided comprising no filtering element, which complicates these prior art circuits more than has been shown and discussed above.

Figure 6:
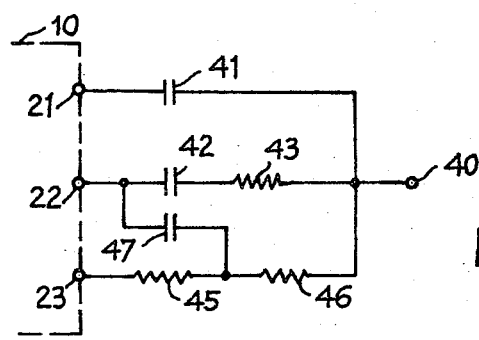
FIG. 6 shows another filtering element arrangement with respect to that of FIG. 4.
Figure 7A:
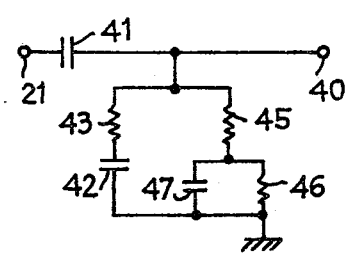
FIGS. 7A, 7B and 7C show the equivalent diagrams of the filters obtained with the circuit of FIG. 6.
Figure 7B:
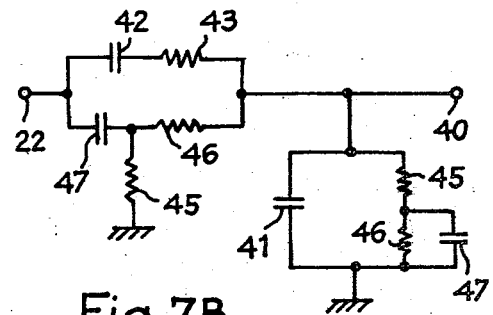
Figure 7C:
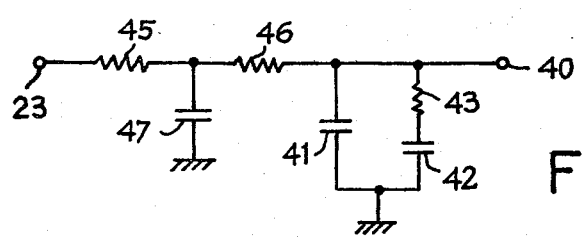

FIG. 6 shows how, by adding a single additional component, in this case a capacitor 47 between terminal 22 and an intermediate point of resistor 44 shown as two series resistors 45 and 46, another type of filter may be obtained having a much more complex filtering function as the equivalent diagrams of FIGS. 7A, 7B and 7C show.

Generally, the process of the invention remains valid if other filtering elements are appropriately added as long as no intermediate ground connection is provided between each of terminals 21, 22 and 23 and terminal 40.

There has been described above by way of example the case where three filtering channels were provided. Of course, in practice, tone control circuits may be provided comprising only two control channels or on the contrary a greater number of channels.

The present invention is not limited to the embodiments which have been explicitly described; it covers the variations and generalizations included within the following claims.

What is claimed is:

1. A tone control circuit for connecting an input terminal with a high impedance input circuit, said tone control circuit including at least two parallel channels with each of said channels including an electronic potentiometer having a low impedance output wherein each of said at least two parallel channels further comprises, a passive filter with each passive filter comprising a series element and a parallel element wherein said series element is connected between the output of each electron potentiometer and said high impedance circuit in such a manner that said parallel element of each of said filter is formed by the parallel association of the series elements of the other of said passive filters of said at least two parallel channels.

2. The circuit as claimed in claim 1, which, except for the filtering elements, is constructed in the form of an integrated circuit.

3. The circuit as claimed in claim 1, comprising two channels, one for low-pass filtering, the other for high-pass filtering, wherein, in the first channel the series element is a resistor and in the second channel, the series element is a capacitor.

4. The circuit as claimed in claim 3, and further comprising a third channel for band-pass filtering, wherein, in said thid channel, the series element comprises a series association of a resistor and a capacitor.

5. The circuit as claimed in claim 4, further comprising a capacitor disposed between the output of the electronic potentiometer of the second channel and an intermediate point of the resistor of the first channel.

6. The circuit as claimed in claim 1, comprising at least one intermediate element between a connection point disposed in the series path at the output of the electronic potentiometer of one channel and the series path at the output of the electronic potentiometer of another channel.

* * * * *